United States Patent [19]
You et al.

[11] Patent Number: 6,020,241
[45] Date of Patent: Feb. 1, 2000

[54] POST METAL CODE ENGINEERING FOR A ROM

[75] Inventors: Jyh-Cheng You, I-Lan; Pei-Hung Chen, Hsin-Chu; Shau-Tsung Yu, Taipei; Yi-Jing Chu, Hsin-Chu, all of Taiwan

[73] Assignee: Taiwan Semiconductor Manufacturing Company, Hsin-Chu, Taiwan

[21] Appl. No.: 08/995,338

[22] Filed: Dec. 22, 1997

[51] Int. Cl.[7] ................................................. H01L 21/8236
[52] U.S. Cl. ............................................. 438/278; 257/390
[58] Field of Search ........................... 257/390; 438/275, 438/278, 279

[56] References Cited

U.S. PATENT DOCUMENTS

| | | | |
|---|---|---|---|
| 4,356,042 | 10/1982 | Gedaly et al. ........................... | 438/279 |
| 4,513,494 | 4/1985 | Batra ....................................... | 438/217 |
| 5,429,974 | 7/1995 | Hsue et al. .............................. | 438/278 |
| 5,429,975 | 7/1995 | Hsue et al. .............................. | 438/278 |
| 5,436,185 | 7/1995 | Hsue et al. .............................. | 438/275 |
| 5,488,009 | 1/1996 | Hsue et al. .............................. | 438/278 |
| 5,514,609 | 5/1996 | Chen et al. .............................. | 438/278 |
| 5,561,624 | 10/1996 | Chen et al. .............................. | 365/104 |
| 5,654,576 | 8/1997 | Hsue et al. .............................. | 257/390 |
| 5,681,772 | 10/1997 | Chen et al. .............................. | 438/278 |
| 5,712,203 | 1/1998 | Hsu ........................................ | 438/275 |

*Primary Examiner*—Wael Fahmy
*Assistant Examiner*—William David Coleman
*Attorney, Agent, or Firm*—George O. Saile; Stephen B. Ackerman; William J. Stoffel

[57] ABSTRACT

The present invention provides a method of manufacturing a read only memory that is code implanted late in the process after the first level metal thus reducing the turn around time to ship a customer order. The invention comprising the steps of: forming bit lines 125 and word lines 160 in a cell area 12A and MOS transistors in a peripheral area 13 of an integrated circuit; forming a first dielectric layer 300 over the surface; etching back the first dielectric layer 300 in the cell area; forming metal contacts 700 to the MOS devices in the peripheral areas 13; forming the second dielectric layer 320 over the resultant surface, storing the integrated circuit; and programming the ROM region 12A by the steps of forming a Code mask 340 with openings 340A from over portions of word lines in the cell area and implanting impurities through the openings 340A into substrate under the selected word lines 160 thereby programming the ROM device.

10 Claims, 10 Drawing Sheets

FIG. 1A — Prior Art

POST METAL CODE ENGINEERING FOR A ROM

BACKGROUND OF INVENTION

1) Field of the Invention

The invention relates to semiconductor integrated circuits and their manufacture. The invention relates to a process for programming Read only memories for semiconductor integrated circuits and more particularly, relates to a process for factory programming individual read only memory cells late in the processing sequence.

2) Description of the Prior Art

To make a ROM (Read only memory), it is necessary to fabricate a storage cell that maintains data after the applied power is turned off, that is, a storage cell having almost permanent data characteristics. The storage cells are generally mass data storage files where each cell corresponds to the presence or absence of a transistor. Data is programmed into the cells during their manufacture. The process of programming data is often called coding. Examples of cell coding methods include field oxide programming, implant programming, and through-hole programming.

Field oxide programming provides for two types of metal oxide semiconductor field effect transistors (MOSFET) by the use of different gate oxide layer thickness for each transistor type. Each oxide layer thickness corresponds to a different transistor threshold voltage. In programmed cells, the thickness of the gate oxide layer is about the same thickness as the field oxide, thereby providing a transistor which is permanently "off" or in a logic "0" state. Unprogrammed cells include typical thicknesses for the gate oxide layer so that the transistor is "on" or in a logic "1" state. A disadvantage of the field oxide programming method includes a longer product turn-around-time (TAT) as measured from the programming step. Much of the process occurs after programming the gate oxide layers of the cells.

Another programming technique is the threshold voltage implant method which changes the transistor threshold voltage by ion implanting the transistor gates for programmed cells. In n-channel devices, impurities such as boron are implanted into exposed gates which raise their threshold voltage. The implant forces the gates of the cells permanently to an "off" state. Unexposed gates are not implanted and therefore provide cells at an "on" state. Heavy implants, however, often create damage to the thin gate oxide region. Damage to the gate oxide region causes higher parasitic junction capacitance between the source (or drain) and channel region of the metal oxide semiconductor field effect (MOS) transistor. Higher parasitic junction capacitance leads to an increase in average word-line capacitance, and often results in slower speeds.

Another method of ROM programming includes selectively opening the contact holes for each transistor to drain. Such method called the through-hole contact programming technique was, in fact, the historical ROM programming method. The through-hole contact programming technique, however, requires a contact for every cell, thereby increasing the size of the cell array. Increasing the size of the cell array often provides a resulting device which has a lower cell density. Lower cell density typically corresponds to higher integrated circuit costs, and less memory capacity which is incompatible for the higher memory ROM devices.

It is often desirable to apply the ROM code onto the partially completed devices during a latter part of the manufacturing process. By applying the code at the latter process, it takes less time to process the wafer from that point to completion. Less time for completion corresponds to a faster product turn-around-time. As the life cycle of integrated circuits become shorter, it is typically desirable to fabricate products with shorter turn-around-times.

Industry relies on two general types of ROM array structures and combinations thereof using cells fabricated by the described methods. Such array structures include the serial ROM cell structure which is a NAND gate type structure and the parallel ROM cell structure known as the NOR gate type structure. Characteristics of NOR and NAND gate type structures are often competing.

A parallel NOR gate type structure includes a set of MOS transistors connected in parallel to the bit-line. The parallel structure typically increases the speed of the ROM but decreases bit or cell packing density. The lower density is caused by the use of a larger cell size. The larger cell size exists from the contacts needed for each cell.

Alternatively, a serial NAND gate type structure often increases cell packing density or bit density but provides a slower operation speed. The serial structure forms a denser structure since no contact holes are required. Higher memory requirements for state-of-art devices use the denser serial NAND gate type structure.

FIG. 1A is a cross-sectional view of a programmed cell 10 for a typical prior art ROM device fabricated by the threshold voltage implant method. The programmed cell may be used for a NAND gate type array structure. The threshold voltage implant method changes an enhancement mode n-channel metal oxide semiconductor field effect transistor (MOSFET) into a depletion mode device by implanting n-type ions into the channel region of the MOS transistor. The n-type implant programs or codes the transistor of the cell.

The programmed cell 11 includes a depletion mode MOS transistor in a semiconductor substrate 1. The programmed cell defines a p-type well region 20, field oxide regions 2, gate oxide region 4, and source/drain regions 12, 14. The programmed cell also defines an implanted channel region 15 under the gate oxide region 4. The implanted channel region changes the enhancement mode MOS transistor into the depletion mode transistor. A polysilicon gate 16, gate sidewall spacers 13, borophosphosilicate glass layer 30 (BPSG), metallization layer 70, and surface passivation 80 are also shown. The polysilicon gate, source region, drain region, and channel region define the depletion mode MOSFET.

Each cell, such as the cell of FIG. 1A, corresponds to a region for storing bits of information in a ROM semiconductor integrated circuit chip. Thousands and even millions of these microscopically small regions make up a core memory area (or active cell area) of the ROM chip. The completed ROM chip also includes peripheral circuits, interconnects, and bonding pads.

A simplified ROM fabrication process of the inventor's may be briefly outlined as follows:

(1) Provide semiconductor substrate.
(2) Grow gate oxide layer.
(3) Deposit gate polysilicon layer and dope.
(4) Mask 1: Define gate polysilicon layer to form polysilicon gate regions.
(5) Mask 2: Define N− type LDD regions and implant.
(6) Mask 3: Define P− type LDD regions and implant.
(7) Form sidewall spacers on the polysilicon gate regions and densify.
(8) Mask 4: Define N+ type source/drain regions and implant.

(9) Mask 5: Define P+ type source/drain regions and implant.
(9A) Wafers stored in wafer bank waiting for customer orders
(10) Mask 6: Define exposed ROM code regions.
(11) Implant exposed regions to provide ROM code.
(12) Form oxide layer.
(13) Deposit BPSG layer and reflow.
(14) Mask 7: Define contact plug regions on BPSG layer.
(15) Etch contact plug holes through BPSG and oxide layer.
(16) Mask 8: Define contact plug implant regions and implant.
(17) Anneal contact plug implant.
(18) Sputter aluminum metallization.
(19) Mask 9: Define aluminum metallization.
(20) Deposit surface passivation layers.
(21) Mask 10: Define pad regions with pad mask.

This sequence of processing steps codes or programs the ROM at steps 10 and 11. Prior to the programming steps, the partially completed wafer typically awaits for a customer ROM code at the wafer bank. After receiving the ROM code, the partially completed wafer is removed from the wafer bank, is coded, and undergoes the remaining process steps to form the completed wafer. The completed wafer then undergoes assembly and testing before the completed product is delivered to the customer.

Product TAT typically begins at mask 6 and ends upon shipping the packaged and tested product to the customer. The prior art fabrication method requires at least twelve major layers must be formed to complete the wafer and typically may take up to 28 days. The completed wafer then under goes assembly and testing which often takes additional days. It is often desirable to reduce the number of processing steps from the coding step to final testing of the device. Less steps after coding generally reduces product TAT for the customer.

A major challenge in ROM manufacturing is to reduce the turn around time by customizing the ROM by the code implant late in the process sequence. This should be done with an uncomplicated and low-cost process.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,514,609 (Chen et al.) shows a method of Code implant through Glass to reduce product delivery time. U.S. Pat. No. 5,561,624 (Chen et al.) teaches a method of ROM array coding after metallization. U.S. Pat. No. 4,513,494 (Batra) shows a method of late mask processing for RAM. The patent etches back through a silicon oxide layer down to a SiN stop layer. The code implant is performed through the SIN layer.

From the above it is seen that a method of fabricating semiconductor ROM devices that is easy, reliable, cost effective, and identifiable is often desired.

SUMMARY OF THE INVENTION

It is an object of the present invention to provide a method of forming a ROM device where the code implant is performed later in the process sequence thus providing a faster product turn around time(TAT) to the customer.

It is an object of the present invention to provide a method of forming a ROM device where the code implant is performed through a BPSG layer 300 and a PE-Oxide layer 320 after metal etching thus providing a faster product ship time.

It is an object of the present invention to provide a method of forming a ROM device where the code implant is performed through a BPSG layer and a PE-Oxide layer after metal etching where the BPSG layer and PE-oxide layer protect the product better than the prior art processes.

It is an object of the present invention to form a ROM device designed without 1st level metal overlying the cell area where the code implant region is formed that allows the device to be processed by a Post metal code engineering process.

Major points of the invention are that the code ion implant is done after the source/drain contact metal is formed (e.g., 1st metal etch)and that the power device is designed so that no first level metal (310 700) is formed over the "cell" area 12A where the code I/I is performed. The cell area 12A is the area of the ROM device where the code implant region is formed. This significantly reduces the time from wafer storage/code implant Engineering to product shipment.

The invention does not form any 1st level metal 310 700 (e.g., contact metal) in the cell area. See FIGS. 2 through 5, and 6A to 6E.

The method of the present invention for forming a semiconductor device comprises the steps of:

a) FIGS. 1B & 2—providing a partially completed semiconductor device having peripheral area 13 and a cell area 12A over a semiconductor substrate 10; at least a word line (e.g., gate electrode) 160, and Bit lines 125 (e.g., doped regions) over the cell area 12A; at least a gate electrode, and source/drain regions over the peripheral area 13;

b) See FIG. 2—forming a first dielectric layer 300 overlying the word line 160, the first dielectric layer composed of borophosphosilicate glass; the first dielectric layer 300 having a thickness in a range of between about 5000 and 7000 Å;

c) defining contacts holes through the first dielectric layer 300 in the peripheral area exposing the source and drain regions;

d) FIG. 3—Using a special ROM mask 305, removing a thickness of the first dielectric layer 300 overlying the word line 160 in the cell area 12A; the remaining first dielectric layer 300 having thickness in a range of between about 2000 and 4000 Å;

e) forming 1st level metal contacts 310 (700) to the source and drain regions 120 140 in the peripheral area 13;

f) FIG. 4—forming a second dielectric layer 320 over the first dielectric layer; the first dielectric layer 300 and second dielectric layer 320 having a combined thickness ranging between about 3000 A and about 7000 Å; the second dielectric layer composed of a PE-oxide layer having a thickness in a range of between about 1000 and 3000 Å;

g) storing the semiconductor device;

h) FIGS. 5, 7A & 7c—performing a code implant in the cell area by implanting impurities through the first and second dielectric layers 300 320 and through at least a portion of the word line; forming a code implant region 150;

i) FIG. 5—and annealing the implant semiconductor device to activate the implanted impurities in the code implant region thereby programming the semiconductor device.

Important features of the invention are:
1) design of ROM device with first level metal 310 700 not positioned above the cell area 12A so that the code implant can be performed after 1st level metal etch and 1st PE-OX (2 KÅ) passivation deposition 320. See FIGS. 5 and 6E.

2) Adding BOE dip back after BPSG reflow using a ROM mask (*W/opening over the cell area) to reduce the BPSG thickness over only the cell area and not the remainder of the chip (e.g., peripheral areas). This will form a code implant window. See FIG. 3.

3) The original total thickness of the first dielectric (BPSG) layer 300 is about 11 KÅ, but is reduced to about 9 KÅ after the ROM mask/BPSG dip etch back. See FIGS. 2 and 3. This is substantially thicker than the prior art dielectric layer thicknesses and better protects the devices.

4) The invention uses a high powered B++ 360 Kev code implant 1000 (FIG. 5) through about 10 kÅ of the first and second dielectric layers 300 320. The code implant can be performed after PE-OX 2 K deposition then followed by RTA and final PE-SiN passivation layer.

Benefits of the various embodiments include additional protection of the wafer by both the first 300 and second dielectric layers 320. Another benefit is the faster product turn-around-time that occurs by programming the device at a later process step than the prior art. In particular, less steps are needed to complete the wafer after programming the cells than the prior art. An additional benefit includes the use of the dielectric layer 300 320 overlying various cell structures before the program step. The first and second dielectric layers 300 320 makes the partially completed wafer more durable than a wafer with only a BPSG layer 300.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1A is a cross-sectional view of a prior art ROM semiconductor device.

DETAILED DESCRIPTION OF THE PREFERRED EMBODIMENTS

The present invention is shown in FIGS. 2 through 5, 7A, 7B and 7c. FIGS. 2 through 5 show an embodiment of the present invention where the ROM device is designed so that contact (1st level) metallization 310 700 is not formed in a cell area 12A.

Figure 1B:
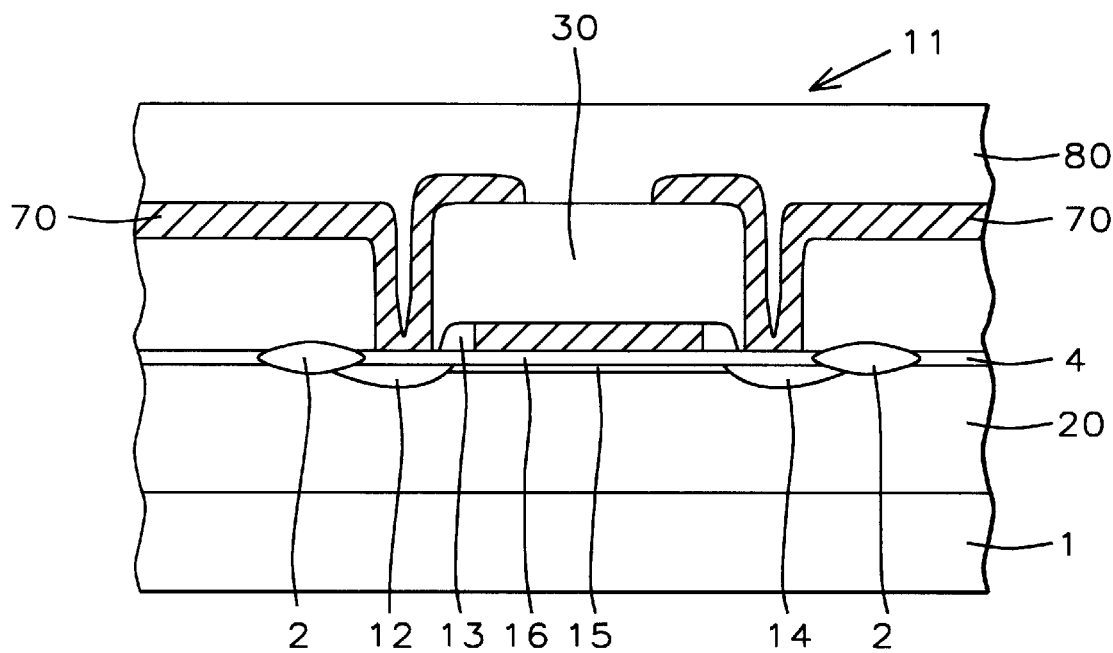
FIG. 1B shows a top down view of the chip 14 having a cell area 12A and a peripheral area 13 according to the method of the present invention.
Figure 1B:
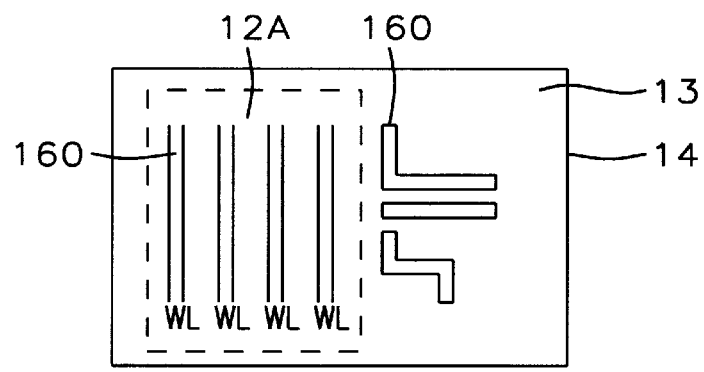

FIG. 1B shows a top down view of a chip 14 having a cell area 12A and a peripheral area 13. Word lines 160 (e.g., conductive gates) are formed over the cell area 12A. Devices such as gates 160 are formed in the peripheral area 13. It is important to note that the first level metal 310 is not formed in the cell areas 12A but is formed over the peripheral areas 13.

A partially completed semiconductor device is provided having a peripheral area 13 and a cell area 12A over a semiconductor substrate 10. See FIGS. 1B & 2. The cell area is the area where the Code implant region 150 will be formed to customize the ROM device. The cell area 12A comprises at least a polysilicon word line 160, and Bit lines 120 140 (e.g., buried doped regions). The peripheral area 13 has FET devices comprising a gate electrode, and source/drain regions.

Figure 2:
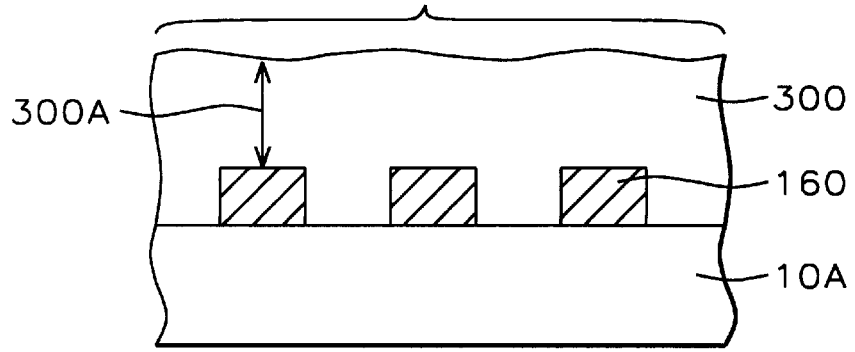
FIGS. 2, 3, 4, and 5 are cross sectional views of the first embodiment of the process of the invention for forming a ROM.

Still referring to FIG. 2, a first dielectric layer 300 is formed overlying the word line 160 and over the substrate 10. The first dielectric layer is preferably composed of borophosphosilicate glass BPSG. The first dielectric layer 300 preferably has a thickness 300 A in a range of between about 5000 and 7000 Å.

Next, in the peripheral areas, contact holes through he first dielectric layer 300 are formed exposing the source and rain regions in the substrate.

Figure 3:
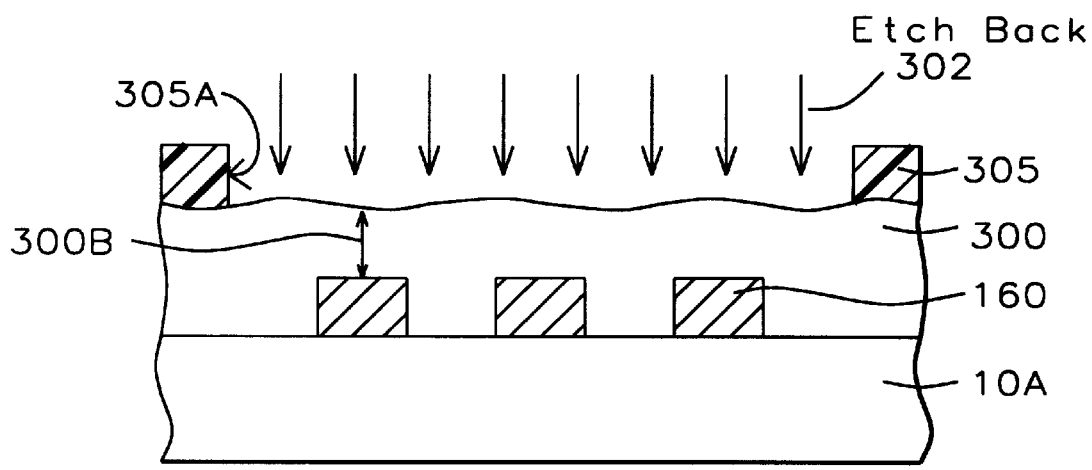

Turning to FIG. 3, in a key step, a ROM mask 305 with ROM opening 305A over the cell area 12A is formed over the resultant surface. The ROM mask covers the peripheral area 13. An etch is performed, in the cell area 12A, to remove a first thickness of the first dielectric layer 300 overlying the selected word lines 160. The remaining first dielectric layer 300 has a thickness 300 B over the wordline 310 in a range of between about 2000 and 4000 Å. Preferably, a conventional ROM photoresist mask 305 is formed over the first dielectric layer 300 having an ROM opening 305A over the cell area 12A. Importantly, the first dielectric layer 160 over the peripheral areas is not etched back.

A metal layer 310 is formed over the dielectric layer 300. The metal layer 310 can represent any metallization process including a one metal (700 see FIG. 6A) or two metal layer contact/interconnection schemes. The metal layer 310 can represent metal contacts (e.g., Plugs) that are formed in the contact holes to contact source/drain regions in the peripheral regions 13 of the wafer. Also, metal layer 300 can be the second metal layer that interconnects contacts (e.g., plugs) to dope regions in the substrate. Most important, FIG. 4 shows that the metal layer 310 is not deposited in the cell areas 12A.

Figure 4:
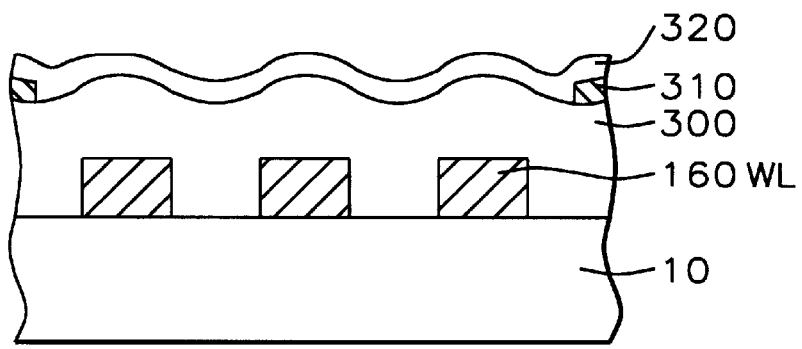

Still referring to FIG. 4, a second dielectric layer 320 is formed over the first dielectric layer 300. The first dielectric layer 300 and second dielectric layer 320 preferably have a combined thickness ranging between about 3000 Å and about 7000 Å. The second dielectric layer is preferably composed of a PE-oxide layer having a thickness in a range of between about 1000 and 3000 Å. The second dielectric layer acts as an extra passivation layer not found in the prior art.

Next the semiconductor device is stored or "banked". The device is held awaiting the details of the customer order which will determine the exact configuration of the code implant.

Figure 5:
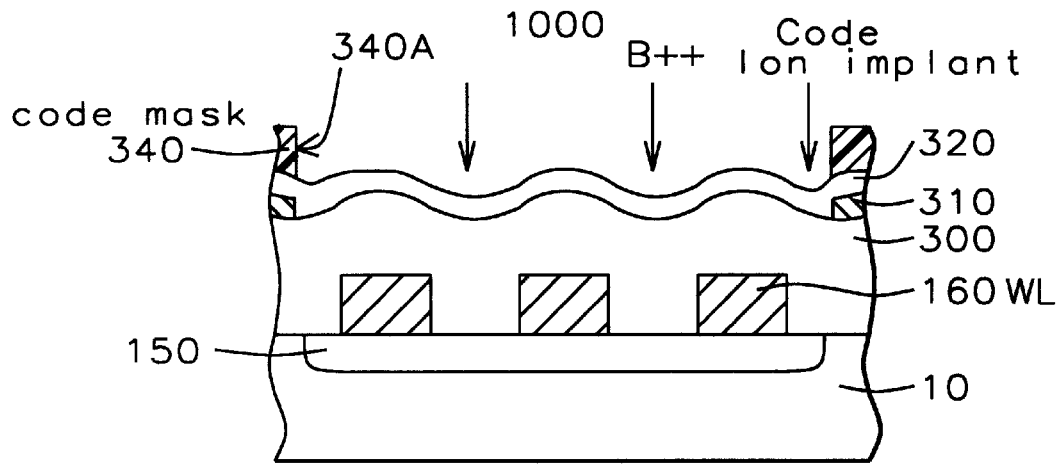

As shown FIG. 5, a code implant is performed in the cell area 12A through opening 340A in a code implant mask 340.

The code implant implants impurities through the first and second dielectric layers 300 320 and through at least a portion of the word line 160 thereby forming a code implant region 150 in the substrate. FIG. 7B shows a top down view of the cell area and code implant opening 340A.

The table below gives the preferred parameters for the code implant.

TABLE

Preferred Code implant parameters

| parameter | units | Low | Target | high |
|---|---|---|---|---|
| Implant energy | Kev | 300 | 320 | 360 |
| dose | atoms/cm$^2$ | 1E14 | 2E14 | 3E14 |
| Ion type | | | Boron - double ionized (B++) | |
| Thickness of layer 300 320 in code window | Å | 7000 | 9000 | 10,000 |
| concentration of code region 150 | Atoms/Cm$^3$ | 5E19 | 1E20 | 2E20 |

Subsequently, an anneal is performed on the semiconductor device to activate the implanted impurities in the code implant region 150 thereby programming the semiconductor device. The annealing of the partially completed device removes damage from the implant and is performed after ion implantation. The impurities improve the enhancement mode MOS transistor. The anneal is preferably performed at a temperature in a range of between about 800 and 950° C. for a time in a range between about in a range of between about 20 and 180 seconds.

Figure 6A:
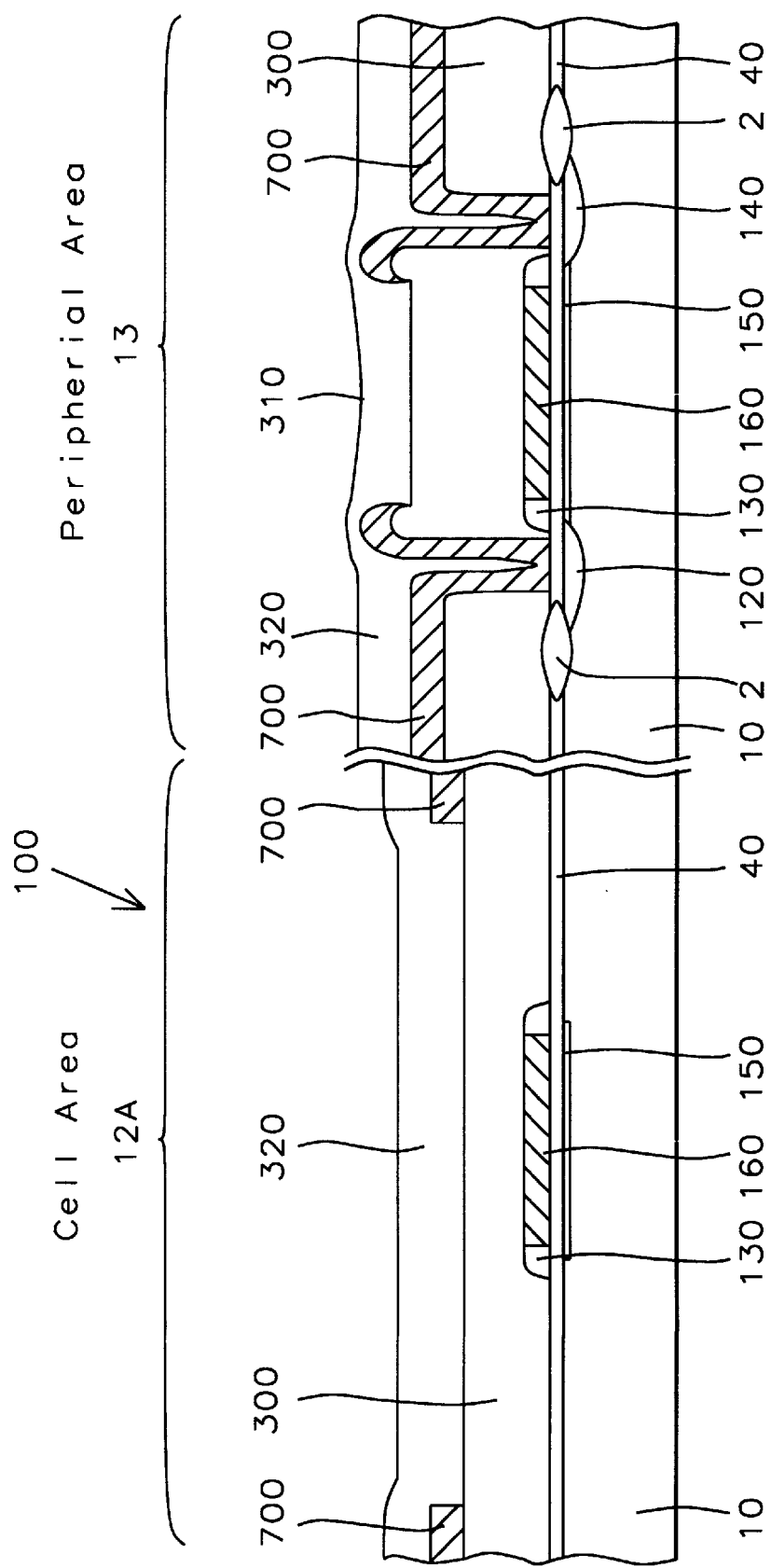
FIGS. 6A through 6E are detailed are cross sectional views of a preferred embodiment of the process of the invention for forming a ROM showing the process step in both the cell area 12A and the peripheral area 13.

FIGS. 6A thorough 6E show the fabrication of devices in both the cell 12A and peripheral areas 13. This illustration is only an example of one process and is not shown in limitation. These figures show an example of process that can be performed concurrently in the cell area 12A and the peripheral area 13.

The finished improved ROM cell 100 is illustrated in FIG. 6A. The improved ROM cell may, for example, be used for NAND type gate structures. Programming or coding the MOS transistor in the cell typically occurs by implanting the channel region with impurities to change an enhancement mode device into a depletion mode or more enhancement mode device. Impurities include n-type and p-type depending upon the particular application. The improved ROM cell includes substrate 10, field oxide regions 2, source region 120, and drain region 140. Alternatively, the cell may also include an n-type well region having corresponding source and drain regions. A polysilicon gate region 160 is defined overlying a thin gate oxide layer 40 defined over the channel region 150. Sidewall oxide spacers 130 are formed on the polysilicon gate edges. The channel region has been implanted or coded with impurities to form a code implant area 150.

The improved ROM cell (see FIG. 6a) includes a first dielectric layer 300 (e.g., BPSG) a second dielectric layer 320 (e.g., PE-oxide), metallization layer 700, and second dielectric layer 320. It should be noted that a portion of the first dielectric layer 300 overlying the polysilicon gate layer in the cell area 12A has a thinner portion (compared to the peripheral area 13) because of the ROM mask 305/etch back. The details in —fabricating the improved ROM cell 100 are illustrated by FIGS. 6B–6E and described below.

Figure 6B:
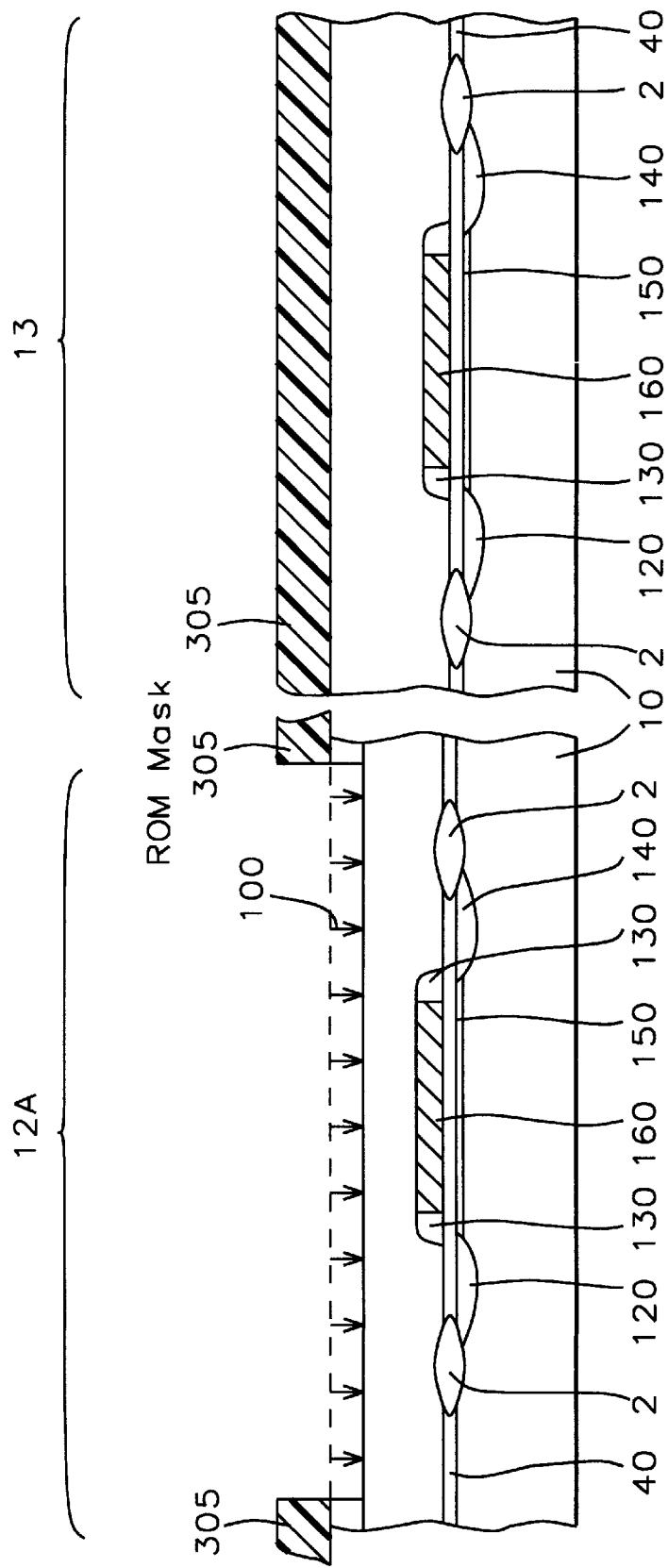
Figure 6C:
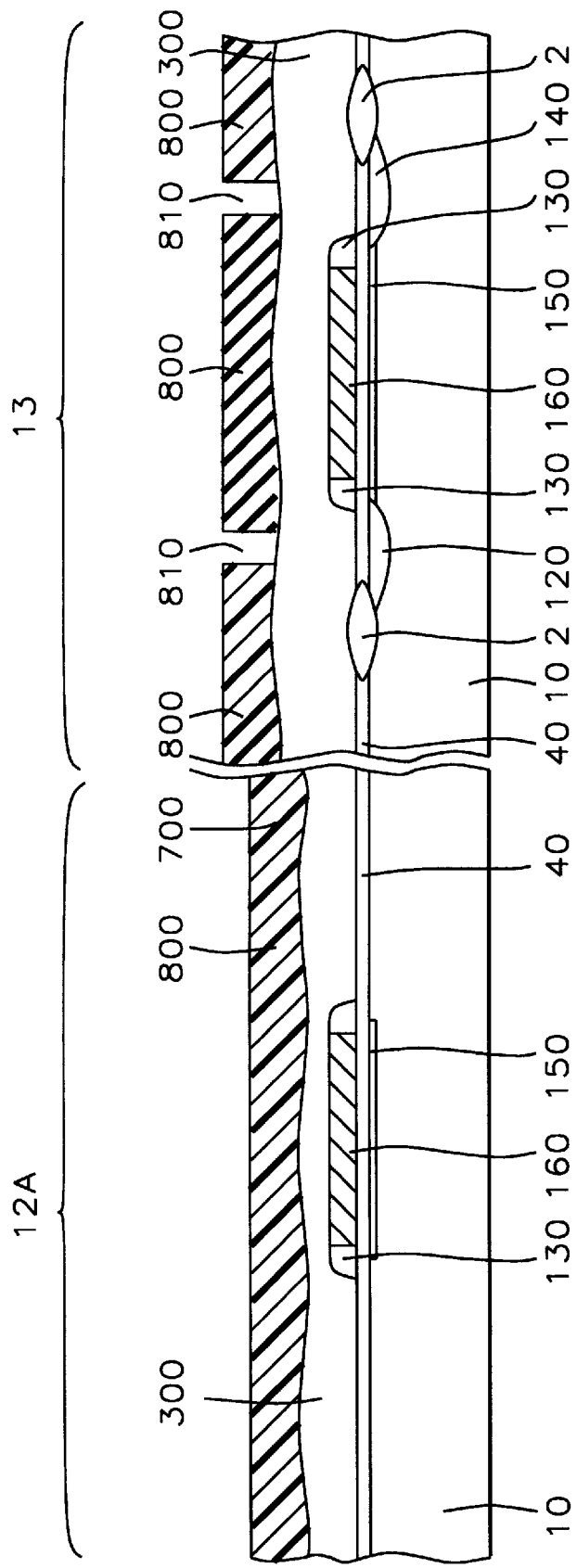

The fabrication method of the invention is as follows:
FIG. 6b—Provide semiconductor substrate.
form source drain regions 120 140 in peripheral area 13 (of ROM cell) by implanting highly doped impurity
Grow gate oxide layer 40
Deposit gate polysilicon layer 160 and dope.
Mask: Define gate polysilicon layer to form polysilicon gate regions 160 and word lines 160 in cell area 12A.
Mask: Define N– type LDD regions and implant.
Mask: Define P– type LDD regions and implant. (For PMOS process)
Form sidewall spacers 130 on the polysilicon gate regions 160 and densify.
optional Mask: Define N+ type source/drain regions 120 140 and implant.
Mask: Define P+ type source/drain regions and implant. (for PMOS process)
FIGS. 2 and 6C—Deposit first dielectric (e.g., BPSG) layer 300 and flow.
FIG. 6c S/D contact Mask 800—Define contact plug regions on BPSG layer 300.
Etch contact plug holes through BPSG layer 300.
FIGS. 3 and 6B—form ROM Mask 305 with openings over Cell area 12A—to etch back BPSG layer 300 over cell area 12A (an extra mask)
FIGS. 3 and 6B—BPSG dip etch back 302 in cell area 12A BPSG reflow
Sputter metallization using high melting point metal form Mask (metal 1 mask): Define metallization and etch metallization to define metal contacts
FIGS. 6D—forming second dielectric layer (PE-oxide)
Bank the wafers (storage)
FIG. 6B—form Code mask 340 with openings 340A over cell area 12A where code implant 150 will be made
code Implant (double implant) exposed regions to provide ROM code.
Anneal contact implant (RTA) to activate code implant areas
Deposit surface passivation layers.
Mask: Define pad regions with pad mask.

FIGS. 6A–6E illustrate a method of fabricating the improved ROM device according to the present invention. The method includes providing a cell having a p-type well region 20. Alternatively, the cell may also have n-type well regions. isolation regions 2 are defined on the cell using the local oxidation of silicon (LOCOS process), shallow trench isolation (STI) or ion implant (I/I) processes.

The gate electrode 160 (or wordline in cell area 13) is formed overlying a thin layer of gate oxide 40. The gate electrode 160 includes a thickness of polysilicon. The thickness of the gate electrode layer depends on the particular application. The gate electrode may also be a silicide gate, polycide gate, or the like, and combinations thereof. The silicide may be selected from refracting metal combinations such as WSi2, TaSi2, TiSi2, CoSi2, MoSi2, among others. The silicide gate typically has less resistivity than heavily doped polysilicon, thereby promoting a faster device.

Figure 8A:
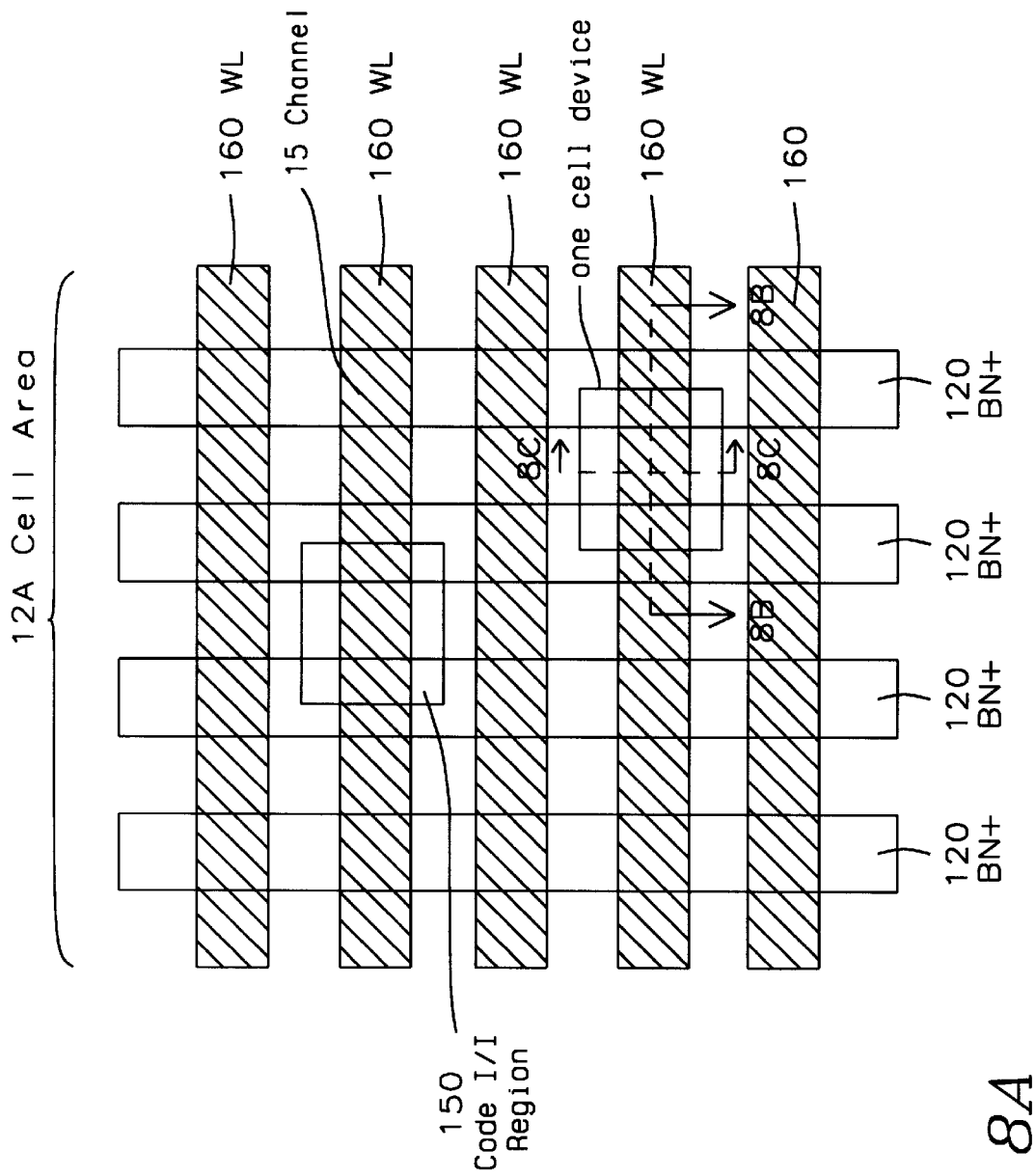
FIG. 8A is a top plan view of the ROM cell area 12A in the code I/I regions 150 according to the present invention.
Figure 8B:
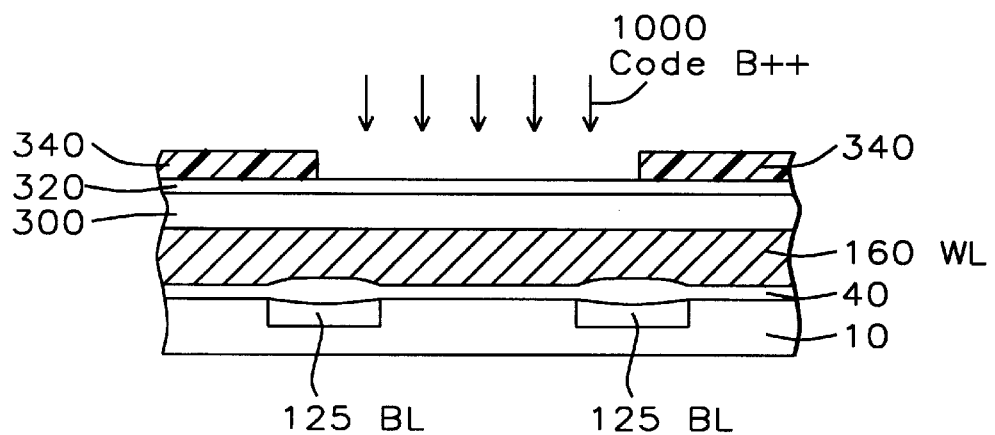
FIG. 8B is a cross-sectional view of the Cell area taken along axis 8B in FIG. 8A.

A source region 120 and drain region 140 can be formed adjacent to the gate electrode in the peripheral area 13 and bit lines 125 formed in the peripheral area (see FIG. 8B.) A channel region forms underlying the gate electrode 160 and between the source 120 and drain 140 regions. Such source and drain regions are fabricated by conventional techniques for forming lightly doped drain (LDD) regions. Implants for the LDD regions occur after forming the gate electrode region. Sidewall spacers 130 are then defined on the gate electrode sides. Source and drain implants are then formed through a self-aligned process. A thin screen oxide layer may be formed over the exposed source and drain regions before their implant. The resulting structure is depicted by FIG. 6B.

The method of the present invention then forms a first dielectric layer 300 overlying the top surface of the cell elements as illustrated in FIG. 2 and FIG. 6B. Such first dielectric layer 300 is typically a non-conformal insulating material, such as borophosphosilicate (BPSG), PSG, among others which is later flowed. The first dielectric layer is most preferably formed of BPSG. The thickness of the first dielectric layer (before etch back) ranges from about 5,000 A to about 7,000 A, and is preferably about 6,000 A. The first dielectric layer also typically includes an underlying layer of oxide of higher quality. Preferably, the oxide layer is also undoped.

FIG. 6B illustrates another photoresist mask 305 or ROM mask 305 formed overlying the top surface of the device. The mask has openings 305A that expose portions of the dielectric layer 300 overlying the word lines (e.g., gate electrodes) in the cell area 12A. See FIG. 7B.

As shown in FIG. 6B, the exposed portion of the dielectric layer 300 is etched using the ROM mask 305 as an etch mask to form a resulting first dielectric layer 300B having a thickness ranging from about 3000 Å to about 5000 Å and preferably at about 4,000 Å. (This is substantially thicker than the prior art.) Etching of the first dielectric layer 300 is typically anisotropic and creates a ROM implant window (shallower dielectric region or recessed region) overlying a portion of the polysilicon word lines region 160. Reactive ion etching, plasma etching, and the like may be used for the anisotropic etch. In contrast to the prior art, the applicant has found a way to keep a higher thickness of first 300 and second dielectric layers 320 over the wafer (in the peripheral areas 13 ) and still allowing for sufficient code implant through these layers in the cell area 12A.

As shown in FIG. 6c, a photoresist mask 800 or contact mask forms over the dielectric layer to define openings 810 over the source 120 and drain 140 regions in the peripheral area 13. An etching step removes exposed portions of the first dielectric layer 300 including the oxide layer to clear off the top surface of the source and drain regions. The etching step is typically an anisotropic etch using a reactive ion etch or plasma etch.

The contact mask is then stripped by techniques known in the art.

Figure 6D:
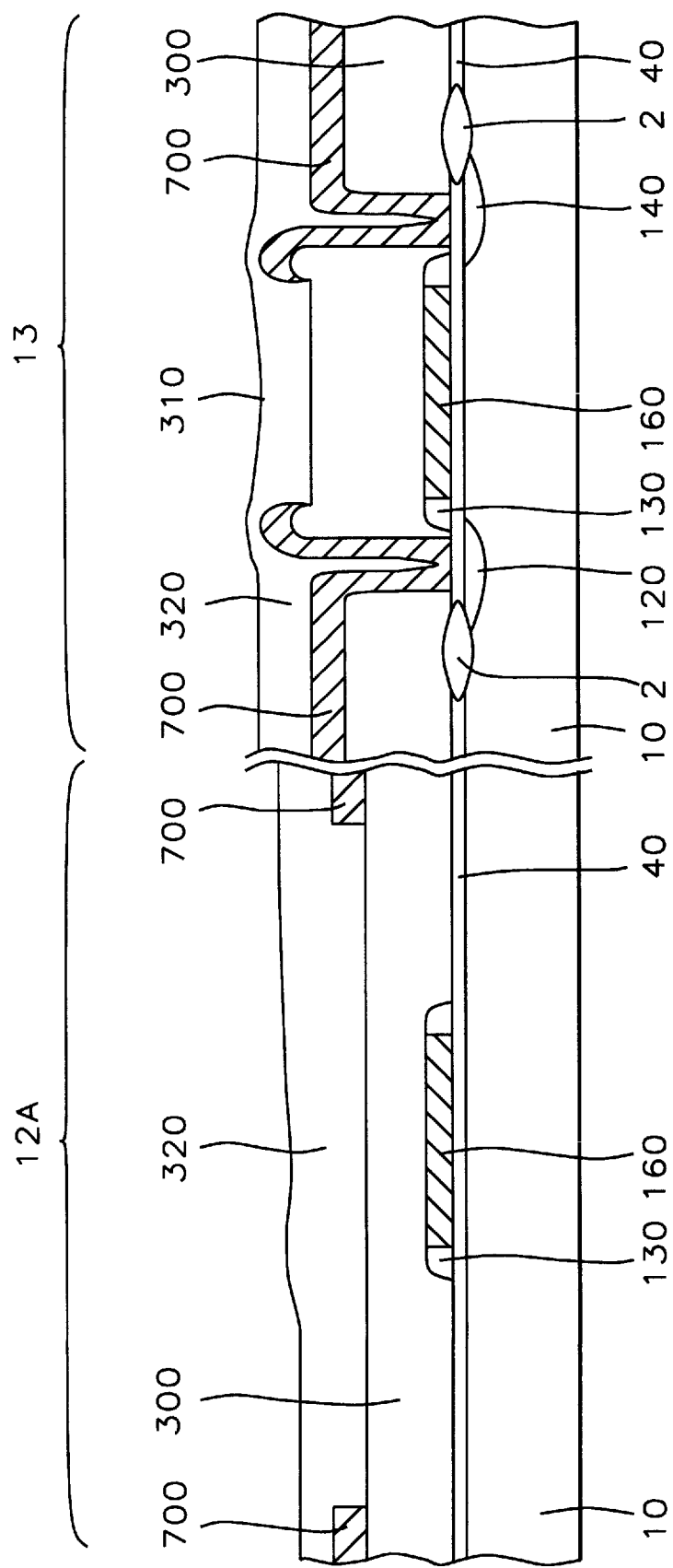

Still referring to FIG. 6D, a first metal layer preferably forms metal contacts 700 to various devices including the source and drain regions 120 140 in the peripheral area 13. FIG. 6D illustrates the device having a metallization layer 700 overlying the source 120 and drain 140 regions. To accomplish this a metal layer 700 is formed over the substrate surface and then patterned using a photomask and an etch. The metal is preferably compose of a high melting point metal such as tungsten (W) and preferably has a thickness in a range of between about 7000 and 10,000 Å. It is important to note that the metal is patterned so that the metal does not remain over the portions of the cell area 12a that will receive the code implantation.

As shown in FIG. 6D, a second dielectric layer 320 is formed over the first dielectric layer. The second dielectric layer is preferably composed of oxide formed by a plasma enhanced process.

The second dielectric layer preferably has a thickness in a range of between about 1500 and 2500 Å and more preferably between 1700 and 2300 Å and most preferably about 2000 Å.

At this point in the process, the wafers can be banked. The partially fabricated wafer having the cell structure of FIG. 4 or 6D is typically stored in wafer bank to await for a customer ROM code. Less fabrication steps occur from this point to the final processing of the wafer than the prior art method, thereby providing an improved method with a faster product turn around time (TAT).

The invention's cell structure also includes a first and second dielectric layer 300 320 and 300 320 overlying the surfaces of the cell which should partially seal and protect the cell surfaces while being stored in the wafer bank. By sealing the cell surfaces, the wafer may be stored at this step over a longer period of time than the prior art. Accordingly, the present method provides wafers having longer storage times and faster product TATs to the customer.

Figure 6E:
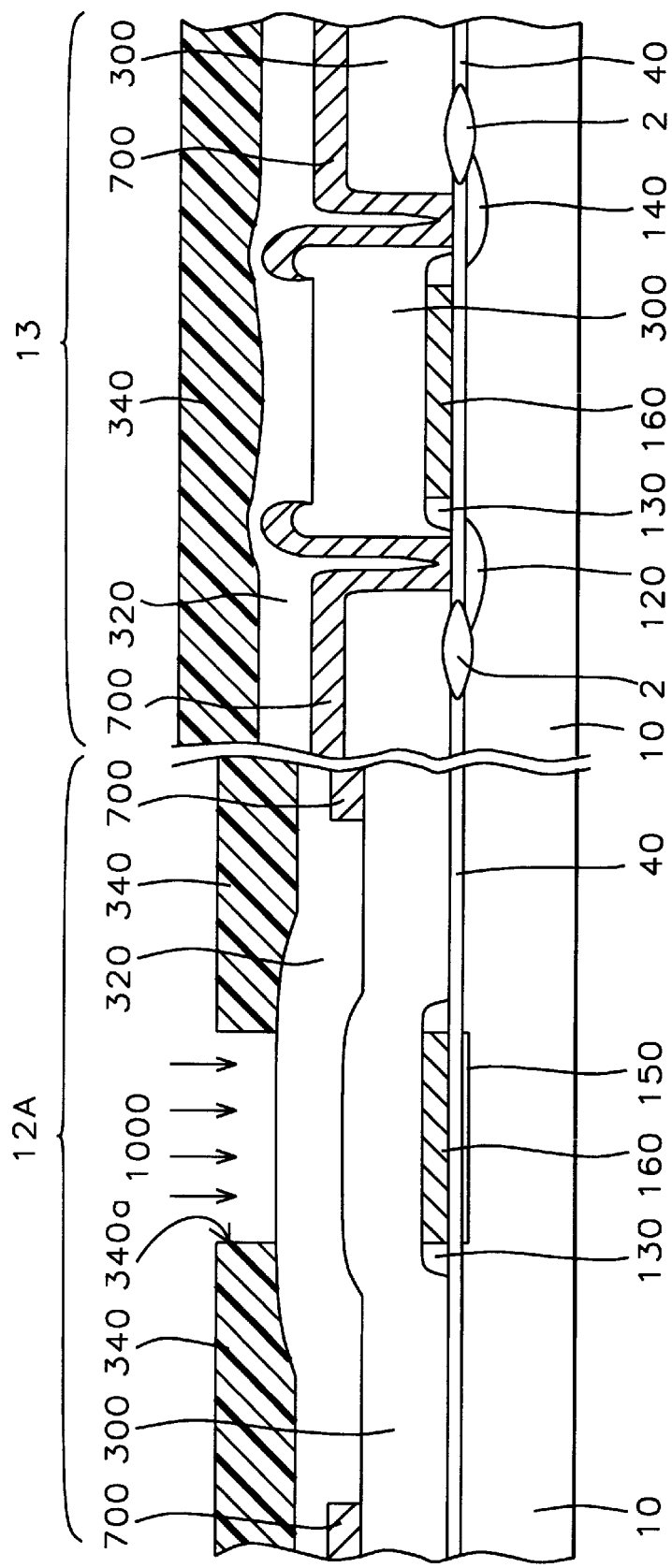

As shown in FIG. 6E, a code implant mask 340 is formed over the resulting surface. The code implant mask 340 has code mask opening 340A over the cell area where the code implant regions will be formed. Also see FIGS. 7A, 7B and 7c.

As shown in FIGS. 6E & 7B, Coding or programming the cell occurs through ion implantation of impurities 1000 thus forming the code implant region 150. Preferably, implantation should penetrate the dielectric layers and gate electrode region. The table below shows the preferred implant parameters.

TABLE

Preferred Code implant parameters

| parameter | units | Low | Target | high |
|---|---|---|---|---|
| Implant energy | Kev | 300 | 320 | 360 |
| dose | atoms/cm$^2$ | 1E14 | 2E14 | 3E14 |
| Ion type | | | Boron - double ionized (B++) | |
| Thickness of layers 300 320 in code window | Å | 7000 | 9000 | 10,000 |
| concentration of code region 150 | Atoms/Cm$^3$ | 5E19 | 1E20 | 2E20 |

Afterwards the code mask is removed.

Next, the code implant region 150 is annealed. The annealing of the partially completed device removes damage from the implant and is performed after ion implantation. The impurities improve the enhancement mode MOS transistor. The anneal is preferably performed at a temperature in a range of between about 800 and 950° C. for a time in a range between about in a range of between about 20 Sec and 180 seconds.

FIG. 6A shows the completed device including the code implant region 150.

Figure 7A:
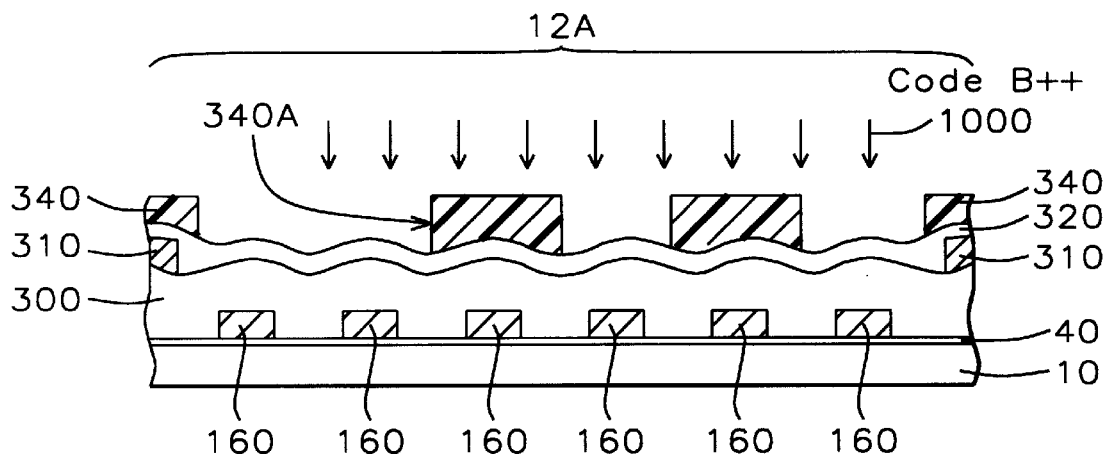
FIG. 7A is a cross-sectional view of the cell area having the code mask 340 according to the method of the present invention.
Figure 7B:
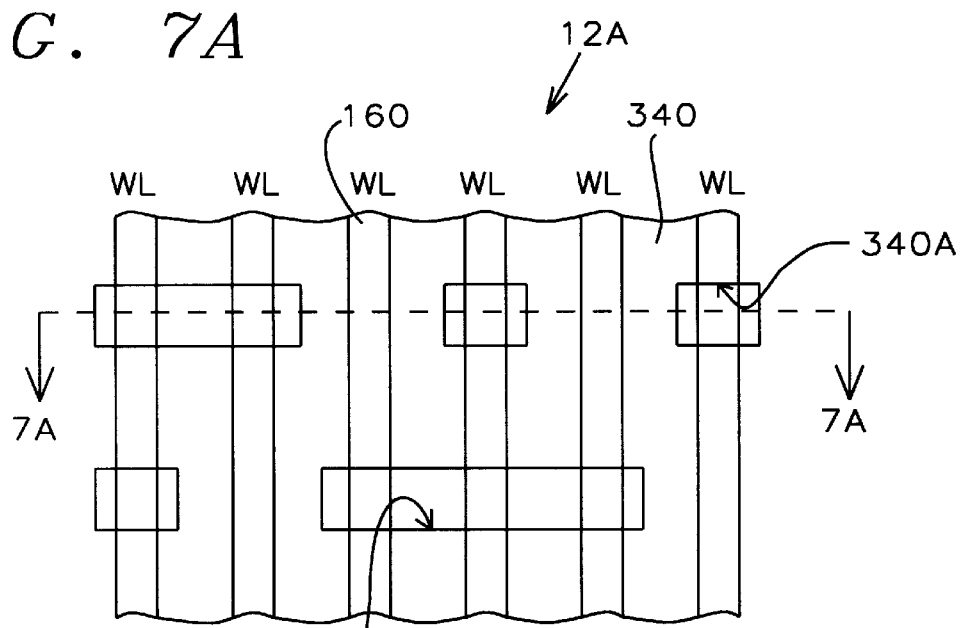
FIG. 7B is a top plan view of the ROM device of the present invention showing the Code mask windows 340A.

FIG. 7A is a cross-sectional view of the cell area 12A having the code mask 340. FIG. 7A is taken along axis 7A in FIG. 7B.

FIG. 7B is a top plan view of the ROM device of the present invention showing the Code mask windows 340A.

Figure 7C:
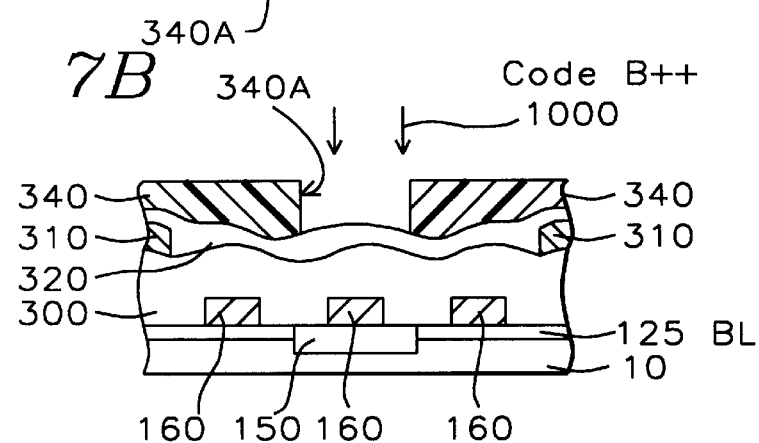
FIG. 7C is a cross sectional view of the ROM device in the cell area of the present invention.

FIG. 7c is a cross sectional view of the ROM device in the cell area of the present invention. FIG. 7C shows bit lines (doped regions) 125 and code implant area 150.

FIG. 8A is a top plan view of the ROM cell area 12A showing the code I/I regions 150.

FIG. 8B is a cross-sectional view of the Cell area taken along axis 8B in FIG. 8A showing bit lines 125.

Figure 8C:
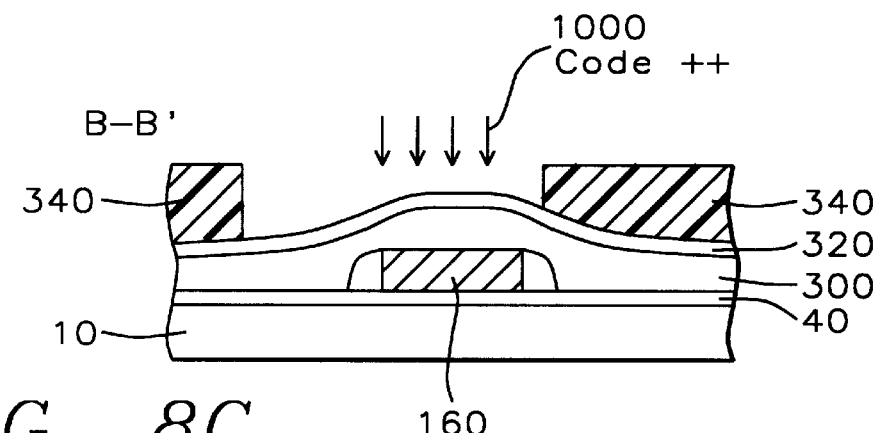
FIG. 8C is a cross-sectional view of the Cell area taken along axis 8C in FIG. 8A.

FIG. 8C is a cross-sectional view of the Cell area taken along axis 8C in FIG. 8A.

Benefits of the various embodiments include additional protection of the wafer by both the first and second dielectric layers. Another benefit is the faster product turnaround-time which occurs by programming the device at a latter process than the prior art. In particular, less steps are needed to complete the wafer processing after programming the cells than the prior art. An additional benefit includes the use of the dielectric layer overlying various cell structures before the program step. The first and second dielectric layers makes the partially completed wafer more durable than a wafer with only a BPSG layer.

The invention is illustrated in an example with regard to the manufacture of a read only memory cell, and read only memory cell which is coded before metallization, but it will be recognized that the invention has a wider range of applicability.

While the invention has been particularly shown and described with reference to the preferred embodiments thereof, it will be understood by those skilled in the art that various changes in form and details may be made without departing from the spirit and scope of the invention.

What is claimed is:

1. A method of forming a semiconductor device comprising the steps of:
   a) providing a partially completed semiconductor device having a peripheral area and a cell area over a semiconductor substrate; at least a word line and bit lines over said cell area; transistors comprising at least a gate electrode, a source region, and a drain region over said peripheral area;
   b) forming a first dielectric layer overlying said word line,
   c) forming a ROM mask having mask ROM openings over portions of said word lines in said cell area; removing a first thickness of said first dielectric layer overlying portions of said word line in said cell area by etching through said mask ROM openings;
   d) forming a first metal layer over said peripheral area and cell area; patterning said first metal layer to at least remove portions of said first metal layer over said cell area;
   e) forming a second dielectric layer over said first dielectric layer;
   f) storing said semiconductor device;
   g) forming a code mask having code mask openings over portions of said word lines in said cell area; performing a code implant in said cell area by implanting impurities through said code mask openings, said first and second dielectric layers and through at least a portion of said word line thus forming a code implant region in said cell area; and
   h) annealing said implant semiconductor device to activate said implanted impurities in said code implant region thereby programming said semiconductor device.

2. The method of claim 1 wherein said first dielectric layer is composed of borophosphosilicate glass; said first dielectric layer has a thickness in a range of between about 5000 and 7000 Å.

3. The method of claim 1 which further includes after step (b) said forming contact openings to said source and drain regions in said peripheral area; and reflowing said first dielectric layer; and
   after step (c) further includes, forming first level metal contacts to said source and drain regions in said peripheral areas.

4. The method of claim 1 wherein after in step (c), the remaining first dielectric layer over said word line having a thickness in a range of between about 2000 and 4000 Å; and said second dielectric layer composed of oxide formed using a plasma enhanced process having a thickness in a range of between about 1000 and 3000 Å; the remaining said first dielectric layer and said second dielectric layer have a combined thickness ranging between about 3000 Å and 7000 Å.

5. The method of claim 1 wherein said code implant is performed at an energy in a range of between about 300 and 360 KeV and a dose in a range of between about 1E14 and 3E14 atom/cm$^2$ and uses Boron ions with a double absolute charge, and the remaining first and said second dielectric layers have a combined thickness ranging between about 4500 and 7500 Å.

6. The method of claim 1 wherein said cell area contains at least portions of two wordlines.

7. A method of forming a semiconductor device comprising the steps of:
   a) providing a partially completed semiconductor device having a peripheral area and a cell area over a semiconductor substrate; at least a word line and bit lines over said cell area; transistors comprising at least a gate electrode, a source region, and a drain region over said peripheral area;
   b) forming a first dielectric layer overlying said word line, said first dielectric layer composed of borophosphosilicate glass; said first dielectric layer having a thickness in a range of between about 5000 and 7000 Å;
   c) forming contact openings to said source and drain regions in said peripheral area;
   d) reflowing said first dielectric layer;
   e) forming a ROM mask having mask ROM openings over portions of said word lines in said cell area;
   f) etching a thickness of said first dielectric layer overlying said word line in said cell area through said ROM mask openings; the remaining first dielectric layer having a thickness in a range of between about 2000 and 4000 Å;
   g) removing said ROM mask;
   h) forming a first metal layer over said cell area and peripheral area;
   i) patterning said first metal layer forming first level metal contacts to said source and drain regions in said peripheral areas and removing said first metal layer over said cell area;
   j) forming a second dielectric layer over said first dielectric layer; said second dielectric layer composed of a PE-oxide layer having a thickness in a range of between about 1000 and 3000 Å; the remaining first dielectric layer and second dielectric layer have a combined thickness ranging between about 3000 Å and 7000 Å;
   k) storing said semiconductor device;
   l) forming a code mask having code mask openings over portions of said word lines in said cell area;
   m) performing a code implant in said cell area by implanting impurities through said code mask openings, said first and second dielectric layers and through at least a portion of said word line, forming a code implant region in said semiconductor substrate; and
   n) annealing said implant semiconductor device to activate said implanted impurities in said code implant region thereby programming said semiconductor device, said code implant is performed at an energy in a range of between about 300 Kev and 360 KeV and a dose in a range of between about 1E14 and 3E14 atom/cm2 and uses Boron ions with a double absolute charge.

8. The method of claim 7 wherein said code implant region has a concentration in the range between about 1E19 and 2E20 atoms/cm$^3$.

9. A method of manufacturing an integrated circuit device comprising the steps of:
   a) providing a partially completed semiconductor device having a peripheral area and a cell area over a semiconductor substrate; at least a word line and bit lines over said cell area; transistors comprising at least a gate electrode, a source region, and a drain region over said peripheral area;
   b) forming a first dielectric layer overlying said cell area and said peripheral area, said first dielectric layer compose of BPSG having a thickness in a range of between about 5000 and 7000 Å;
   c) forming a ROM mask having ROM mask openings over portions of said cell area;
   d) etching said first dielectric layer overlying cell area through said ROM mask openings;
   e) forming contact openings through said first dielectric layer exposing said source region and said drain region in said peripheral area;
   f) forming a first metal layer over said cell area and peripheral area;
   g) patterning said first metal layer forming metal contacts to said source and drain regions, and removing said first metal layer over said cell area;
   h) forming metal contacts to said source and drain regions in said peripheral area;
   i) forming a second dielectric layer over said first dielectric layer and said metal contacts; said second dielectric layer composed of oxide formed using a plasma enhanced process and having a thickness in a range of between about 1000 and 7000 Å;
   j) forming a code mask having code mask openings over portions of said word lines in said cell area;
   k) performing a code implant in said cell area by implanting impurities through said code mask openings, said first and second dielectric layers and through at least a portion of said gate electrode thus, forming a code implant region in said semiconductor substrate; and
   l) annealing said implant semiconductor device to activate said implanted impurities in said code implant region thereby programming said semiconductor device, said code implant is performed at an energy in a range of between about 300 Kev and 360 KeV and a dose in a range of between about 1E14 and 3E14 atom/cm2 and uses Boron ions with a double absolute charge.

10. The method of claim 9 wherein said ROM mask opening overlies portions of at least two gate electrodes and said code mask opening overlies at least portions of two gate electrodes.

* * * * *